US012622157B2

(12) United States Patent
Ko et al.

(10) Patent No.: US 12,622,157 B2
(45) Date of Patent: May 5, 2026

(54) ENCAPSULATION STRUCTURE AND DISPLAY DEVICE HAVING THE ENCAPSULATION STRUCTURE

(71) Applicant: Samsung Display Co., Ltd., Yongin-si (KR)

(72) Inventors: Jieun Ko, Suwon-si (KR); Yohan Kim, Seoul (KR); Yisu Kim, Seoul (KR); Wonmin Yun, Yongin-si (KR); Byoungduk Lee, Seongnam-si (KR); Seungju Lee, Suwon-si (KR); Jaehyuk Lee, Seoul (KR); Hyungdong Lee, Hwaseong-si (KR); Yoonhyeung Cho, Yongin-si (KR); Hyeonseo Cho, Asan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 678 days.

(21) Appl. No.: 17/452,766

(22) Filed: Oct. 28, 2021

(65) Prior Publication Data

US 2022/0285651 A1     Sep. 8, 2022

(30) Foreign Application Priority Data

Mar. 3, 2021     (KR) ........................ 10-2021-0027901

(51) Int. Cl.
*H10K 59/80*     (2023.01)
*H10K 59/12*     (2023.01)
(Continued)

(52) U.S. Cl.
CPC ....... *H10K 59/8731* (2023.02); *H10K 59/874* (2023.02); *H10K 59/12* (2023.02);
(Continued)

(58) Field of Classification Search
CPC . H10K 50/842–846; H10K 59/87–874; H10K 59/80–80524; H10K 59/10–221;
(Continued)

(56) References Cited

U.S. PATENT DOCUMENTS 6,159,277 A * 12/2000 Tanaka ..................... C09D 7/42
428/404
10,622,573 B2     4/2020 Yoo et al.
(Continued)

FOREIGN PATENT DOCUMENTS

CN     102803316 A     11/2012
CN     103098254 A     5/2013
(Continued)

OTHER PUBLICATIONS

"2-(3,4-epoxycyclohexyl)ethyltrimethoxysilane", Gelest product data-base, https://www.gelest.com/product/SIE4670.0/ (retrived 2024).*
(Continued)

*Primary Examiner* — Dale E Page
*Assistant Examiner* — Eric Manuel Mulero Flores
(74) *Attorney, Agent, or Firm* — Womble Bond Dickinson (US) LLP

(57)     ABSTRACT

An encapsulation structure includes an organic encapsula-tion layer. The organic encapsulation layer includes a base resin and hygroscopic composite particles including a hygroscopic composite particle. The hygroscopic composite particle includes a core and a silica layer around the core. The core includes a polymer. The silica layer includes silica.

19 Claims, 3 Drawing Sheets

(51) Int. Cl.
    *H10K 59/122*         (2023.01)
    *H10K 102/00*       (2023.01)

(52) U.S. Cl.
    CPC ..... *H10K 59/122* (2023.02); *H10K 2102/331*
                 (2023.02); *H10K 2102/351* (2023.02)

(58) Field of Classification Search
    CPC ............ C08K 9/04–10; C08K 7/16–20; H10H
               20/852–854; H10H 20/84–841; H10H
               29/852–854; H10H 29/84–8421; H01L
               23/562–576; H01L 23/02; H01L 23/28
    See application file for complete search history.

(56)              References Cited

U.S. PATENT DOCUMENTS

| | | | | |
|---|---|---|---|---|
| 2004/0048533 A1* | 3/2004 | Jimbo | .................... | H10K 59/35 |
| | | | | 442/59 |
| 2005/0053719 A1* | 3/2005 | Ishida | ................. | H10K 59/871 |
| | | | | 428/917 |
| 2012/0091392 A1* | 4/2012 | Daniel | ................. | C08F 220/06 |
| | | | | 252/194 |
| 2013/0140545 A1* | 6/2013 | Kim | ..................... | H10K 50/846 |
| | | | | 257/40 |
| 2013/0249384 A1* | 9/2013 | Sawabe | ................ | H10K 50/858 |
| | | | | 313/504 |
| 2014/0167300 A1 | 6/2014 | Lee | | |
| 2014/0239527 A1* | 8/2014 | Lee | ....................... | B29C 64/106 |
| | | | | 264/17 |
| 2014/0340755 A1* | 11/2014 | Eguchi | ................ | G02B 5/0226 |
| | | | | 359/601 |
| 2015/0084010 A1 | 3/2015 | Noh | | |
| 2016/0172626 A1* | 6/2016 | Suzuka | ............... | H10K 59/877 |
| | | | | 257/40 |
| 2017/0145251 A1* | 5/2017 | Ogawa | ................. | H01L 23/296 |
| 2019/0095018 A1 | 3/2019 | Shin et al. | | |
| 2020/0067020 A1 | 2/2020 | Byun et al. | | |
| 2020/0157302 A1* | 5/2020 | Jing | ........................... | C08J 7/06 |
| 2020/0399441 A1* | 12/2020 | Hori | ....................... | C08K 9/02 |
| 2021/0028395 A1 | 1/2021 | Kim et al. | | |

FOREIGN PATENT DOCUMENTS

| | | | | |
|---|---|---|---|---|
| CN | 106232763 A | 12/2016 | | |
| CN | 109558029 A | 4/2019 | | |
| CN | 110770284 A | 2/2020 | | |
| CN | 110858606 A | 3/2020 | | |
| CN | 112289825 A | 1/2021 | | |
| JP | 2018-184550 A | 11/2018 | | |
| KR | 10-2016-0047613 A | 5/2016 | | |
| KR | 10-1687479 B1 | 12/2016 | | |
| KR | 10-2020-0023570 A | 3/2020 | | |
| KR | 10-2021-0011560 A | 2/2021 | | |
| WO | WO-2020122218 A1 * | 6/2020 | ........... | B01J 20/261 |

OTHER PUBLICATIONS

"What is PMMA?", Acme Plastics, https://www.acmeplastics.com/what-is-pmma (Copyright 2024).*

"2-(3,4-epoxycyclohexyl)ethyltrimethoxysilane", Gelest product database, https://www.gelest.com/product/SIE4670.0/ (retrieved 2024) (Year: 2024).*

"What is PMMA?", Acme Plastics, https://www.acmeplastics.com/what-is-pmma (Copyright 2024) (Year: 2024).*

"Electrospinning", Nano Science Instruments, https://www.nanoscience.com/techniques/electrospinning/#:~:text=Electrospinning%20is%20a%20voltage%2Ddriven,yielded%20from%20a%20polymer%20solution. (retrived Aug. 2024) (Year: 2024).*

Handbook of Nonwovens, Chapter 7: Chemical Bonding, R.A. Chapman, p. 338 (Year: 2007).*

Fluoride Resin Particles for High Performance Industrial Solutions, Made-in-China (Year: 2025).*

Brydson's Plastics Materials (Eighth Edition), Chapter 14—Fluorine-Containing Polymers, Drobny, Jiri. (Year: 2017).*

Korean Office action dated Feb. 20, 2026 for Korean Patent Application No. 10-2021-0027901, 13 pages.

* cited by examiner

1

ENCAPSULATION STRUCTURE AND DISPLAY DEVICE HAVING THE ENCAPSULATION STRUCTURE

CROSS-REFERENCE TO RELATED APPLICATION

This application claims priority to and the benefit of Korean Patent Application No. 10-2021-0027901 filed on Mar. 3, 2021 in the Korean Intellectual Property Office (KIPO), the entire disclosure of which is incorporated by reference herein.

BACKGROUND

1. Field

Embodiments relate to an encapsulation structure and a display device having the encapsulation structure.

2. Description of the Related Art

An organic electronic device is a device comprising at least one layer of an organic material that can conduct an electric current. The organic electronic device may include an organic light emitting device (OLED), an organic solar cell, an organic photoconductor (OPC), or an organic transistor.

The organic light emitting device, that is, a related art organic electronic device, may include a substrate, a first electrode, a light emitting layer, and a second electrode in sequence (e.g., stacked and/or laminated in sequence).

In a structure of a bottom emitting device, the first electrode may be formed as a transparent electrode, and the second electrode may be formed as a reflective electrode layer.

In addition, in a structure of a top emitting device, the first electrode may be formed as a reflective electrode, and the second electrode may be formed as a transparent electrode.

Electrons and holes injected by the electrode may recombine in the emission layer to generate light.

Generally, durability may be desired and/or important in the organic electronic devices. For example, the light emitting layer or the electrode of an organic electronic device may be easily oxidized by foreign substances such as moisture or oxygen. Therefore, it may be desirable to improve durability by protecting against environmental factors.

The above information disclosed in this Background section is for enhancement of understanding of the background of the present disclosure, and therefore, it may contain information that does not constitute prior art

SUMMARY

In order to ensure durability, moisture or oxygen penetrating an organic electronic device may be prevented or substantially prevented by including a thin film layer or a filling layer that includes an encapsulation structure including a hygroscopic material.

Aspects of one or more embodiments of the present disclosure are directed toward an encapsulation structure with improved moisture absorption.

Aspects of one or more embodiments of the present disclosure are directed toward a display device that includes the encapsulation structure.

2

An encapsulation structure according to an embodiment may include an organic encapsulation layer. The organic encapsulation layer may include a base resin and hygroscopic composite particles including a hygroscopic composite particle. The hygroscopic composite particle may include a core and a silica layer around the core. The core may include a polymer. The silica layer may include silica (e.g., $SiO_2$).

In an embodiment, an average diameter of the hygroscopic composite particles may be in a range from about 30 nm to about 1 μm.

In an embodiment, a thickness of the silica layer may be in a range from about 10 nm to about 500 nm.

In an embodiment, the polymer may include at least one selected from the group consisting of polyacrylate (poly (acrylate)), polyacrylamide (poly(acrylamide)), polyacrylic acid (poly(acrylic acid)), polyvinyl alcohol (poly(vinyl alcohol)), polyacrylonitrile (poly(acrylonitrile)), ethylene maleic anhydride copolymer, cellulose, starch, cross-linked polyethylene oxide and copolymers thereof.

In an embodiment, the base resin may include at least one selected from the group consisting of a silicon-based resin, an epoxy-based resin, and an acrylic-based resin.

In an embodiment, a content of the hygroscopic composite particles may be in an amount of about 0.1 wt % to about 40 wt % in the base resin.

In an embodiment, the hygroscopic composite particles may be uniformly dispersed in the base resin.

In an embodiment, a silane group or a compound that includes the silane group may be bonded to a surface of the silica layer.

In an embodiment, the base resin may include a silicon-based resin.

In an embodiment, an epoxy group or a compound that includes the epoxy group may be bonded to a surface of the silica layer.

In an embodiment, the base resin may include an epoxy-based resin.

In an embodiment, an acryl group or a compound that includes the acryl group may be bonded to a surface of the silica layer.

In an embodiment, the base resin may include an acrylic-based resin.

In an embodiment, the encapsulation structure may further include an inorganic encapsulation layer.

A display device according to an embodiment may include a substrate, a display unit on the substrate and a thin film layer on the display unit. The thin film layer may include an organic encapsulation layer. The organic encapsulation layer may include a base resin and a hygroscopic composite particle. The hygroscopic composite particle may include a core and a silica layer around the core. The core may include a polymer. The silica layer may include silica (e.g., $SiO_2$).

In an embodiment, the thin film layer may entirely cover the display unit.

In an embodiment, the display device may further include an inorganic encapsulation layer.

A display device according to an embodiment may include a first substrate, a second substrate facing the first substrate, a display unit on the first substrate and a filling layer on the display unit. The filling layer may include a base resin and a hygroscopic composite particle. The hygroscopic composite particle may include a core and a silica layer around the core. The core may include a polymer. The silica layer may include silica.

In an embodiment, the display device may further include a thin film layer that entirely covers the display unit. The thin film layer may be between the filling layer and the display unit.

In an embodiment, the filling layer may entirely cover the display unit.

In a display device according to embodiments of the present disclosure, a display device may include an encapsulation structure that includes hygroscopic composite particles having a high moisture absorption rate. Because the display device includes a thin film layer or a filling layer that includes the encapsulation structure, and a moisture absorption function is added to the thin film layer or the filling layer, the efficiency of the light emitting device may be improved. Because the encapsulation structure of the display device absorbs moisture, external moisture may not penetrate into an inside of the display device. Accordingly, generation of dark spots on the display device may be prevented or reduced, and thus display quality of the display device may be improved.

Because the hygroscopic composite particles include a core and a silica layer around (e.g., surrounding) the core, the moisture absorption rate of the hygroscopic composite particles may be improved. In addition, because the silica layer may prevent or substantially prevent the core from expanding, the structure of the display device may not be deformed.

DETAILED DESCRIPTION

Figure 1:
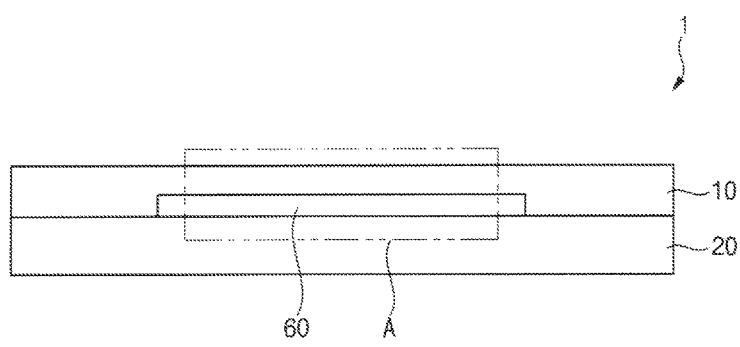
FIG. 1 is a cross-sectional view illustrating a display device according to an embodiment.

Hereinafter, display devices in accordance with embodiments of the present disclosure will be described in more detail with reference to the accompanying drawings. The same reference numerals are used for the same components in the drawings, and redundant descriptions of the same components may not be repeated.

The terminology used herein is for the purpose of describing particular example embodiments only and is not intended to limit the example embodiments described herein.

As used herein, the singular forms "a," "an," and "the" are intended to include the plural forms as well, unless the context clearly indicates otherwise.

It will be further understood that the terms "includes," "including," "comprises," and/or "comprising," when used in this specification, specify the presence of stated features, steps, operations, elements, and/or components, but do not preclude the presence or addition of one or more other features, steps, operations, elements, components, and/or groups thereof.

As used herein, expressions such as "at least one of," "one of," and "selected from," when preceding a list of elements, modify the entire list of elements and do not modify the individual elements of the list.

As used herein, the term "and/or" includes any and all combinations of one or more of the associated listed items.

Further, the use of "may" when describing embodiments of the present disclosure refers to "one or more embodiments of the present disclosure".

It will be understood that when an element is referred to as being "on" or "connected to" another element, it may be directly on, connected, or coupled to the other element or one or more intervening elements may also be present. When an element is referred to as being "directly on" or "directly connected to" another element, there are no intervening elements present.

In the drawings, the relative sizes of elements, layers, and regions may be exaggerated and/or simplified for clarity. Spatially relative terms, such as "beneath," "below," "lower," "above," "upper," "bottom," "top," and the like, may be used herein for ease of description to describe one element or feature's relationship to another element(s) or feature(s) as illustrated in the drawings. It will be understood that the spatially relative terms are intended to encompass different orientations of the device in use or operation in addition to the orientation depicted in the drawings. For example, if the device in the drawings is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly.

As used herein, the terms "substantially," "about," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and refers to within an acceptable range of deviation for the particular value as determined by one of ordinary skill in the art, considering the measurement in question and the error associated with measurement of the particular quantity (i.e., the limitations of the measurement system). For example, "about" may refer to within one or more standard deviations, or within ±30%, 20%, 10%, 5% of the stated value.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

Although the terms first, second, etc. may be used to describe various elements, these elements should not be limited by these terms. These terms are only used to distinguish one element from another element. For example, a first element may be referred to as a second element, and similarly, a second element may also be referred to as a first element without departing from the scope of the present invention.

Unless otherwise defined, all terms (including technical and scientific terms) used herein have the same meaning as commonly understood by one of ordinary skill in the art to which this disclosure pertains. Terms, such as those defined in commonly used dictionaries, should be interpreted as having a meaning that is consistent with their meaning in the context of the relevant art and should not be interpreted in an idealized or overly formal sense, unless expressly so defined herein.

Figure 2:
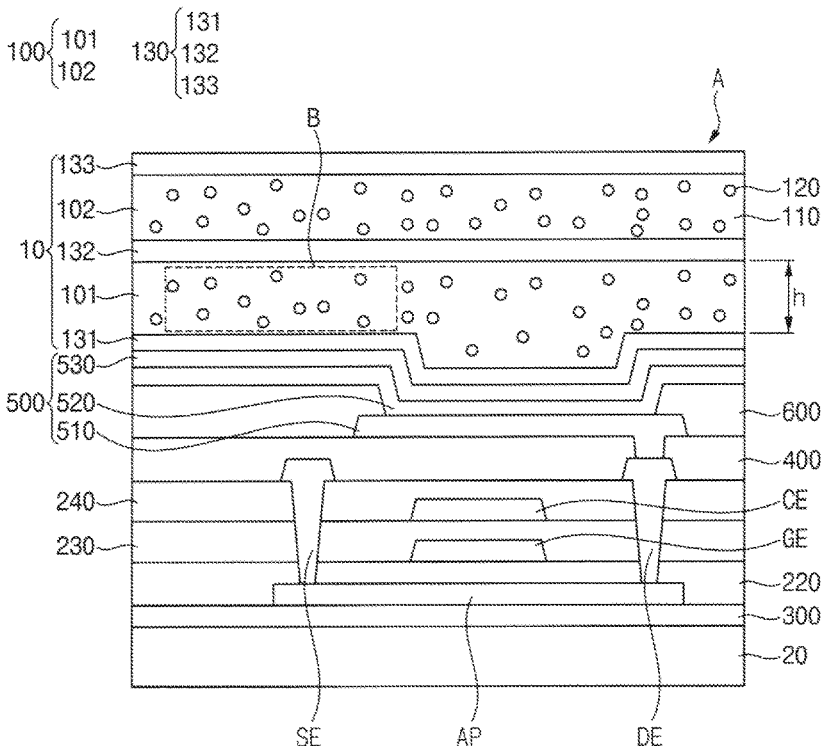
FIG. 2 is an enlarged cross-sectional view of area A of FIG. 1.

FIG. 1 is a cross-sectional view illustrating a display device according to an embodiment. FIG. 2 is an enlarged cross-sectional view of area A of FIG. 1.

Referring to FIGS. 1 and 2, a display device 1 may include a first substrate 20, a display unit 60, and a thin film layer 10.

The first substrate 20 may be a rigid substrate that includes a rigid material such as glass, quartz, acryl, and/or polycarbonate. However, the present disclosure is not limited thereto, and the first substrate 20 may be a flexible substrate that includes a flexible material such as polyimide, epoxy, polyethylene terephthalate, acrylic, and/or silicone.

The display unit 60 may be positioned on the first substrate 20. The display unit 60 may include a plurality of pixels. The plurality of pixels may be arranged in a matrix form in a row direction and a column direction. Each pixel may include a light emitting device and a pixel circuit connected to the light emitting device. The pixel circuit may include at least one thin film transistor and at least one capacitor. However, the present disclosure is not limited thereto. For example, a device other than the light emitting device may constitute the display unit 60 of the display device 1.

The display unit 60 may include a buffer layer 300, an active pattern AP, a gate electrode GE, a capacitor electrode pattern CE, a first insulation layer 220, a second insulation layer 230, and a third insulation layer 240, a first source metal pattern, an interlayer insulation layer 400, a light emitting device 500, and a pixel defining layer 600.

The buffer layer 300 may reduce or block penetration of foreign matter, moisture, and/or external air from under the first substrate 20, and may flatten or planarize the upper surface of the first substrate 20. For example, the buffer layer 300 may include an inorganic material such as oxide or nitride. The upper surface of the buffer layer 300 may be flat or substantially flat.

A first gate metal pattern that includes the gate electrode GE may be disposed on the active pattern AP, and a first insulation layer 220 may be disposed between the active pattern AP and the gate electrode GE.

A second gate metal pattern that includes a capacitor electrode pattern CE may be disposed on the gate electrode GE. The capacitor electrode pattern CE may include a capacitor electrode for forming a capacitor, a wiring for transmitting various suitable signals, etc.

The second insulation layer 230 may be disposed between the gate electrode GE and the capacitor electrode pattern CE. The third insulation layer 240 may be disposed on the capacitor electrode pattern CE.

For example, the active pattern AP may include silicon or a metal oxide semiconductor. According to an embodiment, the active pattern AP may include polycrystalline silicon (polysilicon), and may be doped with an N-type impurity or a P-type impurity.

In another embodiment, the active pattern AP may include a metal oxide semiconductor. For example, the active pattern AP may include indium (In), zinc (Zn), gallium (Ga), tin (Sn), titanium (Ti), aluminum (Al), hafnium (Hf), zirconium (Zr), and/or magnesium (Mg), and may include or be a binary compound (ABx), a ternary compound ($AB_xC_y$), a quaternary compound ($AB_xC_yD_z$), etc. For example, the active pattern AP may include zinc oxide ($ZnO_x$), gallium oxide ($GaO_x$), titanium oxide ($TiO_x$), tin oxide ($SnO_x$), indium oxide ($InO_x$), indium-gallium oxide (IGO), Indium-zinc oxide (IZO), indium-tin oxide (ITO), gallium-zinc oxide (GZO), zinc-magnesium oxide (ZMO), zinc-tin oxide (ZTO), zinc-zirconium oxide ($ZnZr_xO_y$), indium-gallium-zinc oxide (IGZO), indium-zinc-tin oxide (IZTO), indium-gallium-hafnium oxide (IGHO), tin-aluminum-zinc oxide (TAZO) and indium-gallium-tin oxide (IGTO), etc.

The first insulation layer 220, the second insulation layer 230, and the third insulation layer 240 may include silicon oxide ($SiO_x$), silicon nitride ($SiN_x$), silicon carbide, or a mixture thereof and may include an insulating metal oxide such as aluminum oxide, tantalum oxide, hafnium oxide, zirconium oxide, and/or titanium oxide. For example, each of the first insulation layer 220, the second insulation layer 230, and the third insulation layer 240 may have a single layer or a multilayer structure of silicon nitride or silicon oxide, and may have different structures from each other.

The gate electrode GE and the capacitor electrode pattern CE may include a metal, a metal alloy, a metal nitride, a conductive metal oxide, etc. For example, each of the gate electrode GE and the capacitor electrode pattern CE may include gold (Au), silver (Ag), aluminum (Al), copper (Cu), nickel (Ni), platinum (Pt), magnesium (Mg), chromium (Cr), tungsten (W), molybdenum (Mo), titanium (Ti), tantalum (Ta), or an alloy thereof and may include a single layer or a multilayer structure that includes different metal layers.

The first source metal pattern may be disposed on the third insulation layer 240. The first source metal pattern may include a source electrode SE and a drain electrode DE that contact (e.g., electrically contact) the active pattern AP. Each of the source electrode SE and the drain electrode DE may penetrate the lower insulation layer and may contact the active pattern AP. In an embodiment, each of the source electrode SE and the drain electrode DE may penetrate the first insulation layer 220, the second insulation layer 230, and the third insulation layer 240.

The first source metal pattern may include a metal, a metal alloy, a metal nitride, a conductive metal oxide, etc. For example, the first source metal pattern may include gold (Au), silver (Ag), aluminum (Al), copper (Cu), nickel (Ni), platinum (Pt), magnesium (Mg), chromium (Cr), tungsten (W), molybdenum (Mo), titanium (Ti), tantalum (Ta), or an alloy thereof, and may have a single layer or a multilayer structure that includes different metal layers. According to an embodiment, the first source metal pattern may have a multilayer structure that includes aluminum.

The interlayer insulation layer 400 may be disposed on the first source metal pattern. The interlayer insulation layer 400 may include an organic material. For example, the interlayer insulation layer 400 may include an organic insulating material such as a phenol resin, an acrylic resin, a polyimide resin, a polyamide resin, a siloxane resin, and/or an epoxy resin.

The light emitting device 500 may be disposed on the interlayer insulation layer 400. The light emitting device 500 may include a first electrode 510 that contacts (e.g., electrically contacts) the drain electrode DE, a light emitting layer 520 disposed on the first electrode 510, and a second electrode 530 disposed on the light emitting layer 520. The light emitting layer 520 of the light emitting device 500 may be disposed in an opening of the pixel defining layer 600 disposed on the interlayer insulation layer 400. The first electrode 510 may be a lower electrode of the light emitting device 500, and the second electrode 530 may be an upper electrode of the light emitting device 500.

The first electrode 510 may serve as an anode. For example, the first electrode 510 may be formed of a transmissive electrode or a reflective electrode depending on a light emission type. When the first electrode 510 is formed as the transmissive electrode, the first electrode 510 may include indium tin oxide, indium zinc oxide, zinc tin oxide, indium oxide, zinc oxide, tin oxide, etc. When the first electrode 510 is formed as a reflective electrode, the first electrode 510 may include gold (Au), silver (Ag), aluminum (Al), copper (Cu), nickel (Ni), platinum (Pt), magnesium (Mg), chromium (Cr), tungsten (W), molybdenum (Mo), titanium (Ti), etc. The first electrode 510 may have a stacked structure with a material used for the transparent electrode.

The pixel defining layer 600 may have an opening overlapping at least a portion of the first electrode 510. For example, the pixel defining layer 600 may include an organic insulating material.

The light emitting layer 520 may include at least one of functional layers such as a hole injection layer, a hole transport layer, an organic light emitting layer, an electron transport layer, or an electron injection layer in a single layer or a multilayer structure. The light emitting layer 520 may include a low molecular weight organic compound or a high molecular weight organic compound.

In an embodiment, the light emitting layer 520 may emit red light, green light, or blue light. In another embodiment, when the light emitting layer 520 emits white light, the light emitting layer 520 may include a multilayer structure that includes a red light emitting layer, a green light emitting layer, and a blue light emitting layer, or a single layer structure that includes red light emitting material(s), green light emitting material(s), and blue light emitting material(s).

The second electrode 530 may be formed as a transmissive electrode or a reflective electrode depending on the light emission type of the display device. For example, the second electrode 530 may include a metal, an alloy, a metal nitride, a metal fluoride, a conductive metal oxide, or a mixture thereof.

For example, at least a portion of the second electrode 530 and the light emitting layer 520 may be formed as a common layer that extends (e.g., continuously extends) on a display area over the plurality of pixels. However, the present disclosure is not limited thereto, and the light emitting layer 520 may include a plurality of patterns that corresponds to each pixel and are spaced from each other.

The thin film layer 10 may be disposed on the light emitting device 500 of the display unit 60. The thin film layer 10 may be disposed to cover the display unit 60 (e.g., the entire display unit 60). The thin film layer 10 may include a plurality of encapsulation layers. The thin film layer 10 may prevent or substantially prevent moisture and/or air from penetrating into the display unit 60.

The present disclosure is not limited to the display device 1, but may be applied to any suitable electronic device to which the encapsulation structure may be applied.

Hereinafter, the thin film layer 10 will be described.

Figure 3:
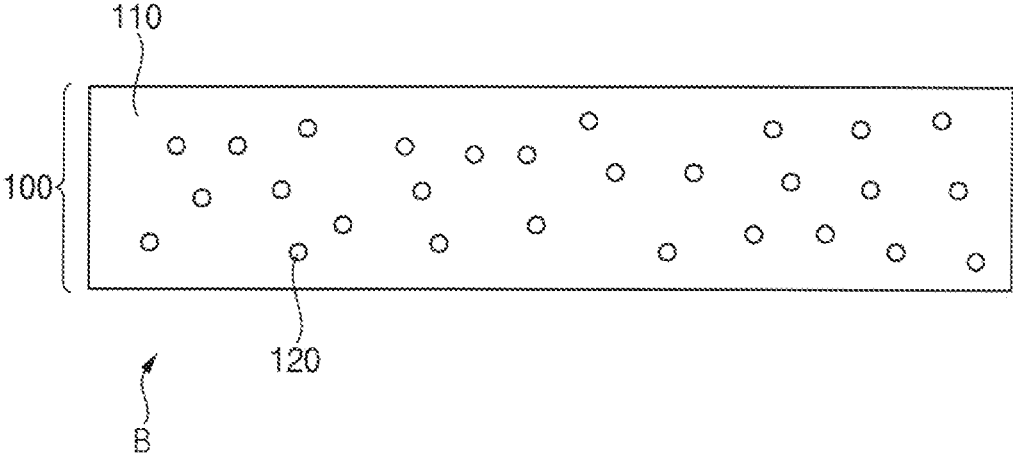
FIG. 3 is an enlarged view of area B of FIG. 2.
Figure 4:
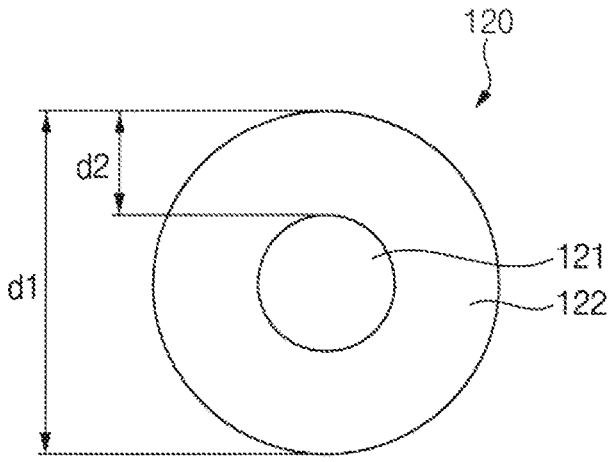
FIG. 4 is a cross-sectional view illustrating an example of a hygroscopic composite particle included in a display device.

FIG. 3 is an enlarged view of area B of FIG. 2. FIG. 4 is a cross-sectional view illustrating an example of a hygroscopic composite particle included in a display device. For example, FIG. 3 may be a figure illustrating an encapsulation structure that includes hygroscopic composite particles and a base resin.

Referring to FIGS. 1-4, the thin film layer 10 may include an organic encapsulation layer 100 and an inorganic encapsulation layer 130. The thin film layer 10 may have a multilayer structure in which the organic encapsulation layer 100 and the inorganic encapsulation layer 130 are stacked (e.g., alternately stacked). For example, the thin film layer 10 may include a first inorganic encapsulation layer 131, a first organic encapsulation layer 101 disposed on the first inorganic encapsulation layer 131, a second inorganic encapsulation layer 132 disposed on the first organic encapsulation layer 101, a second organic encapsulation layer 102 disposed on the second inorganic encapsulation layer 132 and a third inorganic encapsulation layer 133 disposed on the second organic encapsulation layer 102. However, the present disclosure is not limited thereto, and the thin film layer 10 may include at least one organic thin film and at least two inorganic thin films. The organic encapsulation layer 100 may relieve internal stress of the inorganic encapsulation layer 130 and may be formed to be relatively thick. The inorganic encapsulation layer 130 may be formed to be relatively thin. The inorganic encapsulation layer 130 may include a metal oxide and/or a metal nitride. For example, the inorganic encapsulation layer 130 may include $SiN_x$, $Al_2O_3$, $SiO_2$, and/or $TiO_2$.

The organic encapsulation layer 100 may have an encapsulation structure that includes the base resin 110 and the hygroscopic composite particles 120. Each of the hygroscopic composite particles 120 may include a core 121 and a silica layer 122. The core 121 may include a polymer. The silica layer 122 may have a shape that is around (e.g., surrounds) the core 121. That is, the hygroscopic composite particle 120 may have a core-shell structure.

The core 121 may include a polymer having hygroscopicity. The polymer that is included in the core 121 may be selected from the group of polyacrylate (poly(acrylate)), polyacrylamide (poly(acrylamide)), polyacrylic acid (poly (acrylic acid)), polyvinyl alcohol (poly(vinyl alcohol)), polyacrylonitrile (poly(acrylonitrile)), ethylene maleic anhydride copolymer, cellulose, starch, cross-linked polyethylene oxide and copolymers thereof. Because the core 121 may absorb a large amount of moisture, the core 121 may prevent or substantially prevent external moisture from entering the display unit 60.

The silica layer 122 may include silica (e.g., $SiO_2$). The silica layer 122 may also absorb moisture. In addition, the silica layer 122 may be relatively difficult to deform. For example, even after absorbing moisture, a shape of the silica layer 122 may be relatively well maintained.

A moisture absorption rate of the core 121 may be greater than a moisture absorption rate of the silica layer 122. However, a strain rate of a shape of the core 121 may also be greater than a strain rate of the shape of the silica layer 122. Accordingly, the core 121 may absorb external moisture by being disposed in the hygroscopic composite particles 120. In addition, the silica layer 122 may be around (e.g., surround) the core 121, absorb external moisture, and prevent or substantially prevent the core 121 from expanding. The silica layer 122 may maintain the shape of the hygroscopic composite particles 120. Accordingly, in an embodiment, an amount of the moisture absorption of the thin film layer 10 that includes the hygroscopic composite particles 120 may increase, and deformation of the thin film layer 10 may be prevented or reduced. As a result, generation of dark spots in the display device 1 due to external moisture may be prevented or reduced, and deformation of the display device 1 that includes the thin film layer 10 may be prevented or reduced by maintaining a shape of the thin film layer 10.

The base resin 110 may be a thermosetting or photopolymer resin. Therefore, heat or light may be applied to the base resin 110, thereby curing the base resin 110. For example, the base resin 110 may include at least one of a silicone-based resin, an epoxy-based resin, or an acrylic-based resin. In another embodiment, the base resin 110 may be a delay curable resin. That is, the base resin 110 may include a material that is cured after a period of time (e.g., a predetermined period of time) has elapsed.

The hygroscopic composite particles 120 may be uniformly dispersed in the base resin 110. Because the hygroscopic composite particles 120 (or composite moisture absorption particles) are uniformly dispersed in the base resin 110, an area (e.g., an entire area) of the organic encapsulation layer 100 may have a uniform moisture absorption rate.

An average particle diameter (e.g., d1) of the hygroscopic composite particles 120 may be in a range of about 30 nm to about 1 μm. When the average particle diameter of the hygroscopic composite particles 120 is less than about 30 nm, it may be difficult to maintain the shape of the hygroscopic composite particles 120. That is, a minimum particle diameter in which the hygroscopic composite particles 120 (or composite moisture absorption particles) can be formed may be about 30 nm. The average particle diameter of the hygroscopic composite particles may be, for example, a median diameter (D50) measured utilizing a laser diffraction particle diameter distribution meter.

When the particle diameter d1 of the hygroscopic composite particle 120 is greater than about 1 μm, the particle diameter d1 of the hygroscopic composite particle 120 may be larger than the thickness h of the organic encapsulation layer 100. The particle diameter d1 of the hygroscopic composite particle 120 may be smaller than the thickness h of the organic encapsulation layer 100 in order that the hygroscopic composite particle 120 (e.g., the entire hygroscopic composite particle 120) is included in the organic encapsulation layer 100. In addition, when the particle diameter d1 of the hygroscopic composite particle 120 is larger than about 1 μm, a transmittance of the organic encapsulation layer 100 may decrease. In order to ensure the transmittance of the thin film layer 10, the hygroscopic composite particles 120 may be formed to be smaller than about 1 μm.

A thickness d2 of the silica layer 122 may be in a range of about 10 nm to about 500 nm. When the thickness d2 of the silica layer 122 is less than about 10 nm, it may be difficult to maintain an outer shape of hygroscopic composite particle 120. That is, when the thickness d2 of the silica layer 122 is less than about 10 nm, it may be difficult for the silica layer 122 to prevent or reduce deformation of the core 121. Accordingly, the hygroscopic composite particle 120 may be deformed. When the thickness d2 of the silica layer 122 is greater than about 500 nm, the particle diameter d1 of the hygroscopic composite particle 120 may also increase. When the particle diameter d1 of the hygroscopic composite particle 120 is large, the transmittance of the thin film layer 10 may decrease as described above. In addition, when the particle diameter d1 of the hygroscopic composite particle 120 is large, the hygroscopic composite particle 120 may protrude to an outside of the organic encapsulation layer 100.

The hygroscopic composite particles 120 may be included in the base resin 110 in an amount of about 0.1 wt % to about 40 wt %. When a weight ratio of the hygroscopic composite particles 120 is less than about 0.1 wt %, the moisture absorption rate of the organic encapsulation layer 100 may decrease. Accordingly, the dark spots may be more likely to occur in the display device 1 that includes the organic encapsulation layer 100. When the weight ratio of the hygroscopic composite particles 120 is greater than about 40 wt %, the transmittance of the organic encapsulation layer 100 may decrease. Accordingly, a quality of the display device 1 that includes the organic encapsulation layer 100 may decrease.

In an embodiment, a silane group or a compound that includes the silane group may be bonded to a surface of the silica layer 122. Accordingly, a chemical interaction may occur between the hygroscopic composite particles 120 in the base resin 110. Accordingly, a dispersibility of the hygroscopic composite particles 120 may be improved due to the chemical interaction between the hygroscopic composite particles 120.

In this case, the base resin 110 may include a silicone-based resin. That is, a compound bonded to the silica layer 122 and a material constituting the base resin 110 may include a compound of the same series. Therefore, when the polymer constituting the base resin 110 is cured, the hygroscopic composite particles 120 to which the compound is bonded and the base resin 110 may be cured together. That is, a cross-linkage may be formed between the silane group or the compound that includes the silane group and the silicone-based resin. The stability in the organic encapsulation layer 100 may be improved, and the transmittance of the organic encapsulation layer 100 may be improved.

The molecular size of the silane group or the compound that includes the silane group may be relatively small. The silane group or the compound that includes the silane group may be advantageous in removing moisture remaining therein. In addition, the silane group or the compound that includes the silane group may have excellent adhesion by forming a strong chemical bond with a material of another layer. The silane group or the compound that includes the silane group may form a protective film against harmful components and block or reduce penetration of water or chlorine ions.

In another embodiment, an epoxy group or a compound that includes the epoxy group may be bonded to the surface of the silica layer 122. The dispersibility of the hygroscopic composite particles 120 may be improved due to the chemical interaction between the hygroscopic composite particles 120.

In this case, the base resin 110 may include an epoxy-based resin. A cross-linkage may be formed between the epoxy group or the compound that includes the epoxy group and the epoxy-based resin. Accordingly, the stability in the organic encapsulation layer 100 may be improved, and the transmittance of the organic encapsulation layer 100 may be improved.

In another embodiment, an acryl group or a compound that includes the acryl group may be bonded to the surface of the silica layer 122. The dispersibility of the hygroscopic composite particles 120 may be improved due to the chemical interaction between the hygroscopic composite particles 120.

In this case, the base resin 110 may include an acrylic-based resin. A cross-linkage may be formed between the acryl group or the compound that includes the acryl group and the acrylic-based resin. Accordingly, the stability in the organic encapsulation layer 100 may be improved, and the transmittance of the organic encapsulation layer 100 may be improved.

Figure 5:
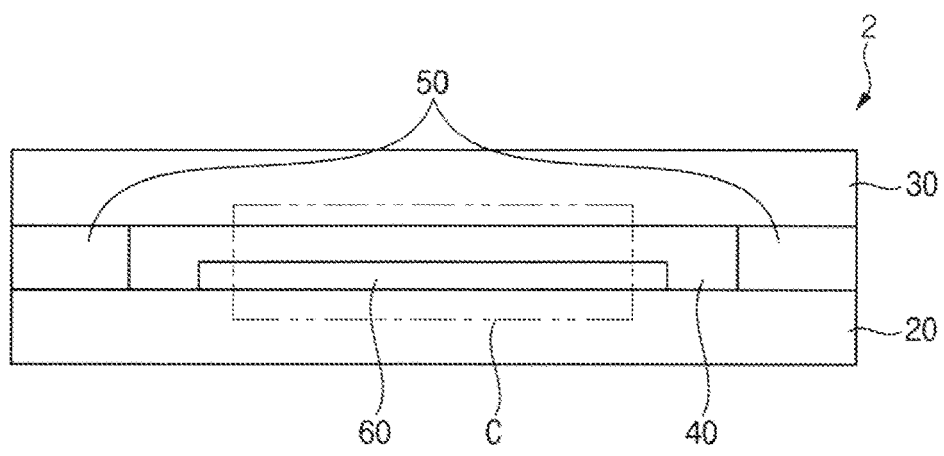
FIG. 5 is a cross-sectional view illustrating a display device according to another embodiment.
Figure 6:
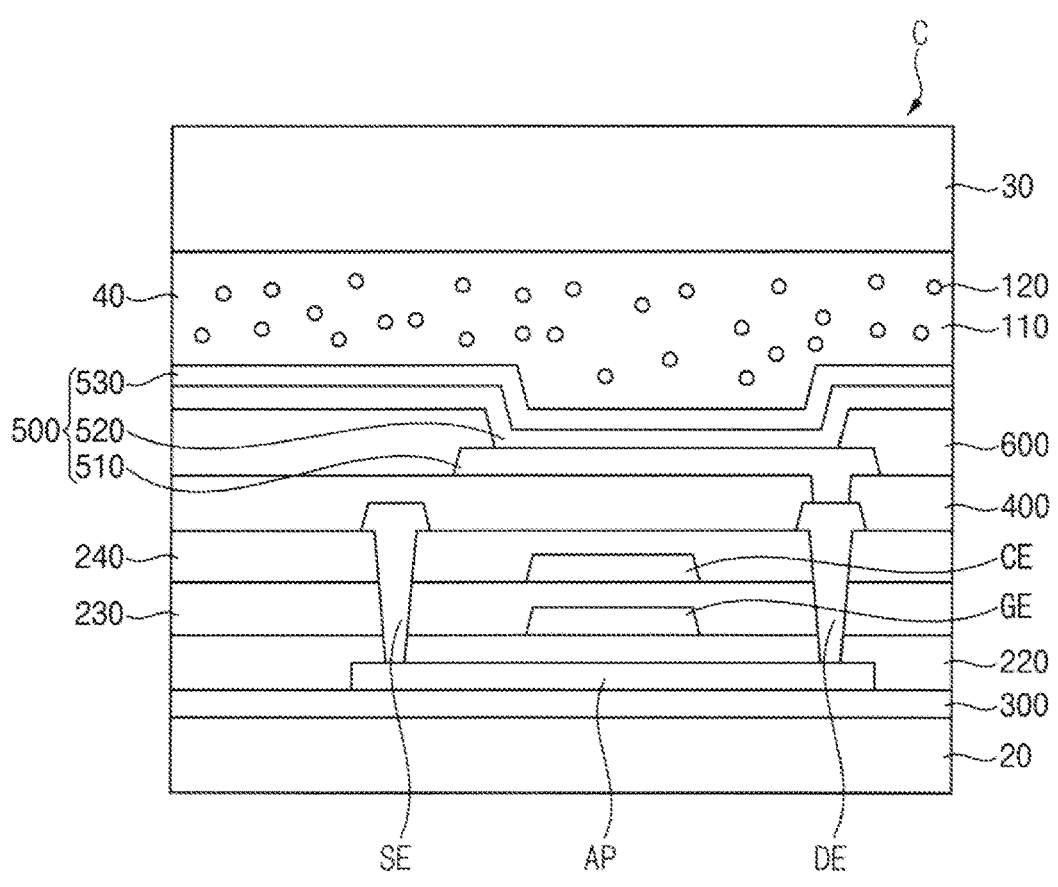
FIG. 6 is an enlarged cross-sectional view of area C of FIG. 5.

FIG. 5 is a cross-sectional view illustrating a display device according to another embodiment. FIG. 6 is an enlarged cross-sectional view of area C of FIG. 5.

In a display device 2 described with reference to FIGS. 5 and 6, components that are the same as those of the display device 1 that have been described above with reference to FIGS. 1-4 may not be described below.

Referring to FIGS. 4-6, the display device 2 may include a first substrate 20, a second substrate 30, a display unit 60, a sealing member 50, and a filling layer 40. The second substrate 30 may be disposed to face the first substrate 20. The second substrate 30 may be bonded to the first substrate 20 through the sealing member 50 and/or the filling layer 40. A sealing glass frit, or the like may be used as the sealing member 50. However, in another embodiment, the sealing member 50 may be omitted.

The filling layer 40 of FIGS. 5 and 6 together with the thin film layer 10 of FIGS. 1 and 2 may fill a space between the first substrate 20 and the second substrate 30. The display device 2 may include a thin film layer. In an embodiment, the thin film layer may be disposed to cover the display unit 60 (e.g., the entire display unit 60). The thin film layer may be disposed between the filling layer 40 and the display unit 60.

The display unit 60 may be disposed on the first substrate 20. The filling layer 40 may be disposed on the display unit 60. The filling layer 40 may be disposed to cover the display unit 60 (e.g., the entire display unit 60). The filling layer 40 may bond the first substrate 20 and the second substrate 30 to each other. In addition, the filling layer 40 may serve to protect the display unit 60. That is, the filling layer 40 may be disposed between the first substrate 20 and the second substrate 30.

The display unit 60 may include a buffer layer 300, an active pattern AP, a gate electrode GE, a capacitor electrode pattern CE, a first insulation layer 220, a second insulation layer 230, and a third insulation layer 240, a first source metal pattern, an interlayer insulation layer 400, a light emitting device 500, and a pixel defining layer 600. The first source metal pattern may include a source electrode SE and a drain electrode DE. The light emitting device 500 may include a first electrode 510, a light emitting layer 520, and a second electrode 530.

The filling layer 40 may have an encapsulation structure that includes the base resin 110 and the hygroscopic composite particles 120. The hygroscopic composite particles 120 (or composite moisture absorption particles) may include a core 121 and a silica layer 122. The core 121 may include a polymer. The silica layer 122 may surround the core 121.

Because the core 121 can absorb a large amount of moisture, the core 121 may prevent or substantially prevent external moisture from entering the display unit 60. The silica layer 122 may include silica (e.g., $SiO_2$). The silica layer 122 may also absorb moisture. In addition, the silica layer 122 may be relatively difficult to deform. For example, even after absorbing moisture, a shape of the silica layer 122 may be relatively well maintained.

A moisture absorption rate of the core 121 may be greater than a moisture absorption rate of the silica layer 122. However, a strain rate of a shape of the core 121 may also be greater than a strain rate of a shape of the silica layer 122. Accordingly, the core 121 may absorb external moisture by being disposed within the hygroscopic composite particles

120. In addition, the silica layer 122 may be around (e.g., surround) the core 121, absorb external moisture, and prevent or substantially prevent the core 121 from expanding. The silica layer 122 may maintain the shape of the hygroscopic composite particle 120. Accordingly, in an embodiment, an amount of the moisture absorption of the thin film layer 10 that includes the hygroscopic composite particles 120 may increase, and deformation of the thin film layer 10 may be prevented or reduced. As a result, an generation of dark spots in the display device 2 due to the external moisture may be prevented or reduced, and the deformation of the display device 2 that includes the thin film layer 10 may be prevented or reduced by maintaining the shape of the thin film layer 10.

The display device 2 according to embodiments of the present disclosure may include the organic encapsulation layer 100 that includes the hygroscopic composite particles 120 that have a high moisture absorption rate. Accordingly, because a moisture absorption function is added to the thin film layer 10 of the display device 2, an efficiency of the light emitting device may be improved. Because the thin film layer 10 of the display device 2 absorbs moisture, external moisture may not penetrate into the inside of the display device 2. Accordingly, the display quality of the display device 2 may be improved by preventing or substantially preventing dark spots from being generated in the display device 2.

Because the hygroscopic composite particles 120 are added to the organic encapsulation layer 100 of the display device 2, an additional process may not be required, when the display device 2 is manufactured.

Because the hygroscopic composite particle 120 includes the core 121 and the silica layer 122, the moisture absorption rate of the hygroscopic composite particle 120 may be improved. Also, because the silica layer 122 may be around (e.g., surround) the core 121, the silica layer 122 may prevent or substantially prevent the core 121 from expanding. Accordingly, the structure of the display device 2 may not be deformed.

The display device according to the embodiments may be applied to a display device included in a computer, a notebook, a mobile phone, a smartphone, a smart pad, a PMP, a PDA, an MP3 player, etc.

Although the encapsulation layer and the display devices according to the embodiments have been described with reference to the drawings, the illustrated embodiments are examples, and may be modified and changed by a person having ordinary knowledge in the relevant technical field without departing from the technical spirit described in the following claims, and equivalents thereof.

What is claimed is:

1. An encapsulation structure comprising:

an organic encapsulation layer that comprises a base resin and a plurality of hygroscopic composite particles, each of the hygroscopic composite particles comprising a core and a silica layer directly around the core, wherein the core comprises a polymer, wherein the silica layer consists of silica and is configured to maintain a shape of the hygroscopic composite particle, and wherein the hygroscopic composite particles are uniformly dispersed in the entire organic encapsulation layer.

2. The encapsulation structure of claim 1, wherein an average diameter of the hygroscopic composite particles is in a range from about 30 nm to about 1 µm.

3. The encapsulation structure of claim 1, wherein a thickness of the silica layer is in a range from about 10 nm to about 500 nm.

4. The encapsulation structure of claim 1, wherein the polymer comprises at least one selected from the group consisting of polyacrylate (poly(acrylate)), polyacrylamide (poly(acrylamide)), polyacrylic acid (poly(acrylic acid)), polyvinyl alcohol (poly(vinyl alcohol)), polyacrylonitrile (poly(acrylonitrile)), ethylene maleic anhydride copolymer, cellulose, starch, cross-linked polyethylene oxide and copolymers thereof.

5. The encapsulation structure of claim 1, wherein the base resin comprises at least one selected from the group consisting of a silicon-based resin, an epoxy-based resin, and an acrylic-based resin.

6. The encapsulation structure of claim 1, wherein a content of the hygroscopic composite particles is in an amount of about 0.1 wt % to about 40 wt % in the base resin.

7. The encapsulation structure of claim 1, wherein a silane group or a compound that comprises the silane group is bonded to a surface of the silica layer.

8. The encapsulation structure of claim 7, wherein the base resin comprises a silicon-based resin.

9. The encapsulation structure of claim 1, wherein an epoxy group or a compound that comprises the epoxy group is bonded to a surface of the silica layer.

10. The encapsulation structure of claim 9, wherein the base resin comprises an epoxy-based resin.

11. The encapsulation structure of claim 1, wherein an acryl group or a compound that comprises the acryl group is bonded to a surface of the silica layer.

12. The encapsulation structure of claim 11, wherein the base resin comprises an acrylic-based resin.

13. The encapsulation structure of claim 1, further comprising an inorganic encapsulation layer.

14. A display device comprising:
a substrate;
a display unit on the substrate; and
a thin film layer on the display unit, the thin film layer comprising an organic encapsulation layer,
wherein the organic encapsulation layer comprises a base resin and a plurality of hygroscopic composite particles, each of the hygroscopic composite particles comprising a core and a silica layer directly around the core,
wherein the core comprises a polymer,
wherein the silica layer consists of silica and is configured to maintain a shape of the hygroscopic composite particle, and
wherein the hygroscopic composite particles are uniformly dispersed in the entire organic encapsulation layer.

15. The display device of claim 14, wherein the thin film layer entirely covers the display unit.

16. The display device of claim 14, further comprising an inorganic encapsulation layer.

17. A display device comprising:
a first substrate;
a second substrate facing the first substrate;
a display unit on the first substrate; and
a filling layer on the display unit,
wherein the filling layer comprises a base resin and a hygroscopic composite particle, the hygroscopic composite particle comprising a core and a silica layer directly around the core,
wherein the core comprises a polymer, and
wherein the silica layer consists of silica and is configured to maintain a shape of the hygroscopic composite particle.

18. The display device of claim 17, further comprising a thin film layer that entirely covers the display unit, the thin film layer being between the filling layer and the display unit.

19. The display device of claim 18, wherein the filling layer entirely covers the display unit.

* * * * *